(12) United States Patent
Ogihara et al.

(10) Patent No.: US 9,201,301 B2
(45) Date of Patent: Dec. 1, 2015

(54) METHOD FOR PRODUCING RESIST COMPOSITION

(71) Applicant: SHIN-ETSU CHEMICAL CO., LTD., Tokyo (JP)

(72) Inventors: Tsutomu Ogihara, Jyoetsu (JP); Yusuke Biyajima, Jyoetsu (JP); Motoaki Iwabuchi, Jyoetsu (JP); Taku Morisawa, Jyoetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 14/264,599

(22) Filed: Apr. 29, 2014

(65) Prior Publication Data

US 2014/0335453 A1 Nov. 13, 2014

(30) Foreign Application Priority Data

May 7, 2013 (JP) .................................. 2013-097714

(51) Int. Cl.
| | |
|---|---|
| *G03F 7/075* | (2006.01) |
| *G03F 7/004* | (2006.01) |
| *C09D 183/04* | (2006.01) |
| *C08L 83/04* | (2006.01) |
| *C08G 77/04* | (2006.01) |
| *B01D 61/14* | (2006.01) |
| *G03F 7/09* | (2006.01) |
| *G03F 7/095* | (2006.01) |
| *G03F 7/11* | (2006.01) |

(52) U.S. Cl.
CPC ................ *G03F 7/004* (2013.01); *B01D 61/14* (2013.01); *B01D 61/145* (2013.01); *C08G 77/04* (2013.01); *C08L 83/04* (2013.01); *C09D 183/04* (2013.01); *G03F 7/0752* (2013.01); *G03F 7/09* (2013.01); *G03F 7/091* (2013.01); *G03F 7/094* (2013.01); *G03F 7/095* (2013.01); *G03F 7/11* (2013.01)

(58) Field of Classification Search
CPC ... G03F 7/0757; G03F 7/0755; C09D 183/04; C09D 183/06; C08L 83/04; C08G 77/04; B01D 61/14; B01D 61/145; B01D 61/147; B01D 61/22; B01D 61/18

USPC .......... 430/270.1, 271.1, 272.1; 210/348, 409
See application file for complete search history.

(56) References Cited

U.S. PATENT DOCUMENTS

| | | | |
|---|---|---|---|
| 4,770,977 A * | 9/1988 | Buiguez et al. ................ 430/323 |
| 8,048,615 B2 * | 11/2011 | Takei et al. .................... 430/313 |
| 8,835,102 B2 * | 9/2014 | Ogihara et al. ................ 430/325 |
| 2001/0041769 A1 * | 11/2001 | Iwasawa et al. ............... 524/588 |
| 2004/0224254 A1 | 11/2004 | Carey et al. |
| 2006/0191854 A1 * | 8/2006 | Sakillaris et al. ............. 210/746 |
| 2007/0238300 A1 | 10/2007 | Ogihara et al. |
| 2008/0023046 A1 * | 1/2008 | Restelli et al. .................... 134/33 |
| 2009/0253884 A1 * | 10/2009 | Ogawa et al. .................... 528/10 |
| 2010/0167212 A1 * | 7/2010 | Cho et al. ....................... 430/313 |
| 2010/0297551 A1 * | 11/2010 | Teranishi ................... 430/270.1 |
| 2012/0129352 A1 * | 5/2012 | Mori et al. ..................... 438/703 |
| 2013/0108958 A1 | 5/2013 | Ogihara et al. |
| 2014/0054738 A1 * | 2/2014 | Yamamoto et al. ........... 257/432 |
| 2014/0148536 A1 * | 5/2014 | Kawabata et al. ............. 524/101 |

FOREIGN PATENT DOCUMENTS

| | | |
|---|---|---|
| EP | 1574901 A1 * | 9/2005 |
| EP | 1 801 619 A2 | 6/2007 |
| JP | B2-4716037 | 7/2011 |
| WO | WO 2005/084777 A1 | 9/2005 |

OTHER PUBLICATIONS

Wu et al., Improving Advanced Lithography Process Defectivity with a Highly retentive 5nm Asymmetric UPE Filter, Entegris, Inc., pp. 1-6 (2009).*
Extended European Search Report issued in European Patent Application No. 14001570.2 on Jul. 25, 2014.
Sep. 24, 2015 Office Action issued in Japanese Patent Application No. 2013-097714.

* cited by examiner

*Primary Examiner* — Amanda C Walke
(74) *Attorney, Agent, or Firm* — Oliff PLC

(57) ABSTRACT

Provided by the present invention is a method for producing a resist composition, especially a silicon-containing resist underlayer film composition, with fewer film defects, the composition used in immersion exposure, double patterning, development by an organic solvent, and so forth. Specifically, provided is a method for producing a resist composition to be used for manufacturing a semiconductor device, wherein the resist composition is filtered using a filter which filters through 5 mg or less of an eluate per unit surface area ($m^2$) in an extraction using an organic solvent.

4 Claims, No Drawings

METHOD FOR PRODUCING RESIST COMPOSITION

FIELD OF THE INVENTION

The present invention relates to a method for producing a resist composition which is used, in microfabrication when manufacturing semiconductor devices and the like.

DESCRIPTION OF THE RELATED ART

As the LSI becomes highly integrated and achieves high-speed processing, the pattern size has been miniaturized rapidly. Lithography technologies, such as adopting light sources with shorter wavelength and correspondingly selecting adequate resist compositions, have contributed to accomplish fine patterning.

When the pattern is miniaturized (i.e. the pattern width is reduced) with the thickness of the photoresist film unchanged, the aspect ratio of the developed photoresist pattern increases, resulting in a collapse of the pattern. Accordingly, the thickness of the photoresist film has been reduced in accordance with the progress of photoresist pattern miniaturization in order to keep the aspect ratio of the pattern within a proper range.

The multilayer resist method is one of the methods to solve such problems. In this method: a resist underlayer film having a different etching selectivity from that of the resist upper layer film (photoresist film) intervenes between the upper layer film and the substrate to be processed; a pattern is formed on the resist upper layer film, and the pattern is transferred to the underlayer film by dry etching, using the upper layer resist pattern as a dry etching mask; and this pattern is further transferred to the substrate by dry etching, using the underlayer film as a dry etching mask.

In recent years, a silicon-containing resist underlayer film has been used as a resist underlayer film for the multilayer resist method because it easily forms a film, has a different etching selectivity from that of the resist upper layer film, and consequently has superior processability. On the other hand, the silicon-containing resist underlayer film composition has a problem that it generates a deposit insoluble in a solvent once a polymer contained therein undergoes a condensation reaction in a pipe or a filter and increases the molecular weight, which is a problem that conventional photoresists such as silicon-uncontaining organic film compositions do not have.

The above is a characteristic of a silicon-containing polymer in the silicon-containing resist underlayer film composition. It is generally said that the deposited polymer is a siloxane gel, which is small enough to pass through a filter with a pore diameter of even about 20 nm, attached to the discharge pipe of the coating equipment which is used to form the silicon-containing film. Accordingly the deposited polymer is observed as a foreign body in the silicon-containing film formed on a substrate for manufacturing a semiconductor device. Under present circumstances, the only way to remove the siloxane gel generated in a pipe or a filter is a filtration using a filter. Thus, an effective means to suppress the generation of a siloxane gel from an eluate of the filter is eagerly wanted.

Patent Document 1: Japanese Patent No. 4716037

SUMMARY OF THE INVENTION

The present invention was made in view of the situation mentioned above. The object of the present invention is to provide a method for producing a resist composition with fewer film defects, the composition used in immersion exposure, double patterning, development by an organic solvent, and so forth.

To solve the problem mentioned above, the present invention provides a method for producing a resist composition to be used for manufacturing a semiconductor device, wherein the resist composition is filtered using a filter from which 5 mg or less of an eluate is eluted per unit surface area ($m^2$) in an extraction using an organic solvent.

A filtration with such a filter enables to produce a resist composition which can provide a film with fewer film defects when applied to a substrate.

The resist composition to be filtered is preferably a silicon-containing resist underlayer film composition.

Forming a film with a silicon-containing resist underlayer film composition enables a pattern transfer without defect when transferring a photoresist pattern formed on an upper layer to a silicon-containing resist underlayer film and then to an organic underlayer film by dry etching.

The organic solvent preferably does not have a hydroxyl group.

Using such an organic solvent enables to extract eluting materials contained in the filter and to suppress the elution from the filter during the production of a silicon-containing film composition.

The filter used to filter the resist composition is preferably formed of a material including at least one of nylon, polyethylene, polypropylene, and fluorocarbon.

The filter is made, for example, of fluorocarbon called Teflon (registered trade name), hydrocarbons such as polyethylene and polypropylene, and nylons.

As explained above, the resist composition, especially the silicon-containing resist underlayer film composition, produced by the method of the present invention, can suppress the generation of film defects when the composition is applied to a substrate for manufacturing a semiconductor device. This method enables a pattern transfer without defect when transferring a photoresist pattern formed on an upper layer film to a silicon-containing resist underlayer film and then to an organic underlayer film by dry etching. Thus, the method enables to increase manufacturing yield of a semiconductor device.

DETAILED DESCRIPTION OF THE PREFERRED EMBODIMENTS

Hereunder, the present invention will be explained in more detail.

The inventors of the present invention have succeeded so far in providing silicon-containing resist underlayer film compositions such as shown in Patent Document 1 by carrying out an extensive investigation on lithography characteristics and stability of a silicon-containing resist underlayer film composition.

However, semiconductor devices are even more miniaturized, and therefore an upper layer resist pattern is also more miniaturized. Thus, a silicon-containing resist underlayer film prepared by spin coating is required to have fewer film defects than before.

In this specification, a film defect means a tiny concavity and convexity generated during the application of a resist composition to a substrate for manufacturing a semiconductor device. The defect contained in a resist film, especially in a silicon-containing resist underlayer film, affects the pattern in the resist upper layer film, often causing a pattern defect. This pattern defect, when transferred by dry etching to a substrate of a semiconductor device, brings about electric problems in a semiconductor device circuit such as an open circuit and a short circuit. This is one of the causes of lower yield of a semiconductor device.

With this background, the inventors carried out an investigation to reduce such a defect, consequently found that using a filter from which a smaller amount of an eluate is eluted during the production of a conventional silicon-containing resist underlayer film composition enables to produce a silicon-containing resist underlayer film composition capable of providing a film with fewer film defects when applied to a substrate, and completed the present invention on the basis of this finding.

The present invention is a method for producing a resist composition to be used for manufacturing a semiconductor device, wherein the resist composition is filtered using a filter from which 5 mg or less of an eluate is eluted per unit surface area ($m^2$) in an extraction using an organic solvent.

Hereunder, detailed embodiments of the present invention are shown; however, the present invention is not restricted thereto.

The present invention enables to form a silicon-containing film with fewer film defects by using a filter from which a smaller amount of an eluate comprised mainly of hydrocarbons is eluted, and thereby suppressing the generation of a siloxane gel in the filter.

The said filter is more effective when the weight of an eluate per unit surface area ($m^2$) of the filter is smaller. However, actually it is impossible to provide a filter from which no eluate is eluted. Practically, the weight of an eluate per unit surface area ($m^2$) of the filter is preferably 5 mg or less.

Ordinarily known organic solvents may be used for the extraction. The organic solvent may be, for example: alcohols such as methanol, ethanol, propanol, butanol, methoxy ethanol, butoxy ethanol, methoxy propanol, and ethoxy propanol; ketones such as acetone, methyl ethyl ketone, and cyclohexanone; ethers such as tetrahydrofuran, dioxane, ethylene glycol dimethyl ether, and diethylene glycol dimethyl ether; esters such as ethyl acetate, butyl acetate, ethyl lactate, ethyl cellosolve acetate, propylene glycol methyl ether acetate, and γ-butyrolactone; aromatic hydrocarbons such as benzene, toluene, and xylene; and chlorinated hydrocarbons such as dichloromethane, dichloroethane, dichloroethylene, and trichloroethylene.

Among these organic solvents, an organic solvent not containing a hydroxyl group is more preferable. Such an organic solvent enables to extract eluting materials comprised mainly of hydrocarbons contained in the filter, and to suppress defects caused by the eluate from the filter during the production of the silicon-containing film composition.

Although there is no particular restriction as to the silicon-containing film composition to be used, compositions such as shown in Patent Document 1 are preferable.

As a material of a filter, materials such as fluorocarbons, celluloses, nylons, polyesters, hydrocarbons are known. As a material of the filter used to filter the resist composition, materials such as a fluorocarbon called Teflon (registered trade name), hydrocarbons such as polyethylene and polypropylene, and nylons are known.

There may be several causes for the generation of an eluate. The materials forming film pores may be a cause, or in the cases of polyethylene and polypropylene filters, the low-molecular-weight by-products of the polymerization when producing the filters may be a cause. It is thought that such an eluate generated from the filter during a filtration act on a highly hydrophilic silanol group in a siloxane polymer, change the state of solvation around the silanol group and thereby cause condensation between the silanol groups, which eventually leads to the formation of a siloxane gel. It is difficult to remove this siloxane gel by the filter because it is originated inside the filter and therefore have a smaller size than the micropores of the filter, enabling the siloxan gel to easily pass through the filter. When a composition containing this gel is applied to e.g. a substrate, a concavity and a convexity may be formed around this siloxane gel on the film. This concavity and convexity may be observed as film defects.

The present invention enables to obtain a film with fewer film defects by filtering a composition using the above described filter from which 5 mg or less of an eluate is eluted per unit surface area ($m^2$) in an extraction using an organic solvent.

EXAMPLE

Hereunder, the present invention will be explained more specifically by showing Example and Comparative Example, but it is not restricted thereto.

Example 1

A 5 nm polyethylene filter (area of 1.1 $m^2$, manufactured by Entegris, Inc.) was cleaned by 20 L of circulating propylene glycol ethyl ether, and this cleaning solvent was discarded. This operation was repeated for 10 times to clean the filter. This filter was put into circulating toluene, having a temperature of 50° C., for 5 hours. The toluene solution thereby obtained was concentrated, and the amount of hydrocarbons contained therein was analyzed by GC-MS. As the result, 2 mg of hydrocarbons having 10 to 40 carbon atoms were detected.

Using the same filter cleaned by the above process in a circulation filtration, the silicon-containing resist underlayer film composition SHB-A94 (manufactured by Shin-Etsu Chemical Co. Ltd.) was prepared. This composition was applied to a substrate by spin coating using Clean Track ACT 12 (manufactured by Tokyo Electron Ltd.), and then baked at 240° C. to form a film. Film defects of this film were measured using the bright field defect detecting instrument (manufactured by KLA-Tencor Corp.). The number of the film defects having sizes of 0.12 μm or more is shown in Table 1.

Comparative Example 1

A 5 nm polyethylene filter (area of 1.1 $m^2$, manufactured by Entegris, Inc.) was put into circulating toluene, having a temperature of 50° C., for 5 hours. The toluene solution thereby obtained was concentrated, and the amount of hydrocarbons contained therein was analyzed by GC-MS. As the result, 8 mg of hydrocarbons were detected.

Using the same filter cleaned by the above process in circulation filtration, the silicon-containing resist underlayer film composition SHD-A94 (manufactured by Shin-Etsu Chemical Co. Ltd.) was prepared. This composition was applied to a substrate by spin coating using Clean Track ACT 12 (manufactured by Tokyo Electron Ltd.), and then baked at 240° C. to form a film. Film defects of this film were measured using the bright field defect detecting instrument (manufactured by KLA-Tencor Corp.). The number of the film defects having sizes of 0.12 μm or more is shown in Table 1.

TABLE 1

|  | Amount of hydrocarbons | Number of-film defects |
|---|---|---|
| Example 1 | 2 mg | 40 |
| Comparative Example 1 | 8 mg | 160 |

It can be seen from Table 1 that the number of the film defects is smaller when the filter from which 5 mg or less of an eluate is eluted was used.

It must be noted here that the present invention is not limited to the embodiments as described above. The foregoing embodiments are mere examples; any form having substantially the same composition as the technical concept of the claims and showing similar effects is included in the technical scope of the present invention.

What is claimed is:

1. A method for filtering a silicon-containing resist underlayer film-forming composition to be used for manufacturing a semiconductor device, wherein the silicon-containing resist underlayer film-forming composition is filtered using a filter from which 5 mg or less of an eluate is eluted per unit surface area ($m^2$) in an extraction using an organic solvent.

2. The method for producing a resist composition according to claim 1, wherein the organic solvent does not have a hydroxyl group.

3. The method for producing a resist composition according to claim 1, wherein the filter is formed of a material including at least one of nylon, polyethylene, polypropylene, and fluorocarbon.

4. The method for producing a resist composition according to claim 2, wherein the filter is formed of a material including at least one of nylon, polyethylene, polypropylene, and fluorocarbon.

* * * * *